(12) United States Patent
Overbeek et al.

(10) Patent No.: US 7,968,011 B2
(45) Date of Patent: Jun. 28, 2011

(54) CONDUCTIVE INK

(75) Inventors: Gerardus Cornelis Overbeek, Waalwijk (NL); Michael Arnoldus Jacobus Schellekens, Waalwijk (NL); Alfred Jean Paul Bückmann, Waalwijk (NL)

(73) Assignee: DSM IP Assets B.V., Heerlen (NL)

( * ) Notice: Subject to any disclaimer, the term of this patent is extended or adjusted under 35 U.S.C. 154(b) by 316 days.

(21) Appl. No.: 12/281,688

(22) PCT Filed: Mar. 6, 2007

(86) PCT No.: PCT/NL2007/050091
§ 371 (c)(1),
(2), (4) Date: Sep. 4, 2008

(87) PCT Pub. No.: WO2007/102734
PCT Pub. Date: Sep. 13, 2007

(65) Prior Publication Data
US 2010/0140564 A1    Jun. 10, 2010

(30) Foreign Application Priority Data

Mar. 7, 2006 (EP) .................................... 06075553

(51) Int. Cl.
*H01B 1/04* (2006.01)
*H01B 1/02* (2006.01)
*H01B 1/22* (2006.01)
*C08K 3/04* (2006.01)
*C08K 3/08* (2006.01)

(52) U.S. Cl. ........ 252/502; 252/503; 252/512; 524/439; 524/495

(58) Field of Classification Search ....... 252/500–521.6, 252/502, 503, 512, 514; 524/439, 495
See application file for complete search history.

(56) References Cited

U.S. PATENT DOCUMENTS

| | | | |
|---|---|---|---|
| 4,088,801 A | 5/1978 | Bolon et al. | |
| 4,390,565 A * | 6/1983 | Fonda ........................... | 427/504 |
| 4,443,495 A | 4/1984 | Morgan et al. | |
| 4,680,225 A * | 7/1987 | Ogawa et al. ............... | 428/847.1 |
| 4,971,727 A * | 11/1990 | Takahashi et al. ............. | 252/511 |
| 5,071,593 A * | 12/1991 | Takahashi et al. ............. | 252/500 |
| 5,594,044 A * | 1/1997 | Yang ............................ | 523/160 |
| 5,622,535 A | 4/1997 | Bradshaw et al. | |
| 6,001,915 A * | 12/1999 | Schwarte et al. ............. | 524/457 |
| 6,797,748 B2 * | 9/2004 | Chen et al. .................... | 523/161 |
| 2003/0151028 A1 | 8/2003 | Lawrence et al. | |
| 2004/0149959 A1 | 8/2004 | Mikhael et al. | |

OTHER PUBLICATIONS

International Search Report for PCT/NL2007/050091, mailed Jun. 19, 2007.

* cited by examiner

*Primary Examiner* — Mark Kopec
*Assistant Examiner* — Jaison P Thomas
(74) *Attorney, Agent, or Firm* — Nixon & Vanderhye P.C.

(57) ABSTRACT

A conductive ink comprising 10 to 75 wt % of at least one solvent comprising ≦20 wt % water; 0 to 50 wt % of at least one radiation curable material having a Mn in the range of from 50 to 10,000 g/mol; 5 to 70 wt % of at least one polyurethane having a Mw in the range of from 4,000 to 70,000 g/mol, 0 to 5 wt % of isocyanate-reactive component(s) bearing ionic or potentially ionic water-dispersing groups and a free isocyanate group content <0.5 wt % and 20 to 85 wt % of a conductive material.

13 Claims, No Drawings

# CONDUCTIVE INK

This application is the U.S. national phase of International Application No. PCT/NL2007/050091, filed 6 Mar. 2007, which designated the U.S. and claims priority to Europe Application No. 06075553.5, filed 7 Mar. 2006, the entire contents of each of which are hereby incorporated by reference.

The invention relates to a conductive ink comprising at least one solvent borne polyurethane, a conductive material and optionally at least one radiation curable material; and a radio frequency identification antenna prepared from such an ink.

By a conductive ink is meant an ink which when in the form of a dry film is conductive. The ink in its "wet" state may be conductive or it may not be conductive. Conductive as used herein refers to electrically conductive. Such conductive inks are suited for various printing techniques such as for example flexographic printing, gravure printing and ink jet printing and can be used in a number of applications, including for example conductive inks for flexible packaging substrates like paper, board and plastic for both surface printing and lamination applications. Such conductive inks may be used for the preparation of printed electronics, for example antennae for radio frequency identification (RFID) devices such as tags and labels. In general RFID labels are adhesively attached to a surface whereas tags are secured by other means such as plastic fasteners or string. RFID devices use printed electronic circuits to store information about a product to which they are attached. The RFID device typically includes a semiconductor chip containing the information and one or more printed antennae. The information on the RFID device may be accessed using radio frequency to generate a current across the central chip.

Typically traditional methods to produce electronic components such as RFID antennae and circuit boards are multi-step subtractive processes involving etching or stamping of copper sheets. Printed electronic components prepared via additive printing processes offer many economical and environmental advantages compared to these traditional subtractive methods. With a growing market for printed electronic components such as low cost printed RFID devices a need exists for inks that are conductive after application and that may be applied via convenient printing processes such as flexographic, gravure and ink jet printing onto a broad range of substrates. In traditional thick film technologies inks known in the art comprising a binder and a conductive material are typically pastes that are applied via screen printing, after which the binder is generally removed after application to enhance conductivity. Binder removal is usually achieved through very high temperature curing (typically well above 650° C.), which is a time consuming and costly process and eliminates the possibility of using temperature sensitive low cost substrates like paper and plastic foils. Alternatively reactive metal solutions may be applied and cured substantially without binder material at reduced temperatures (typically 150 to 300° C.), which results in good conductivity but poor final film properties. We have however found that the presence of a binder material is important for protection of the conductive material in order to prevent unwanted chemical or mechanical damage to the conductive material which may result in a loss in conductivity. We have also found that a suitable binder material is needed in order to obtain good flexibility of the resultant film as well as abrasion resistance, and to obtain good adhesion of the conductive layer to the substrate.

In addition there is an increase in demand for high line speed printing, especially at line speeds greater than 200 m/min or even greater than 300 m/min. However, at such line speeds printability problems such as cob-webbing may occur for flexographic printing and scumming may appear for gravure printing processes. One cause of such problems is the limited resolubility, also called redispersibility, of the binders used in the inks in the typical solvents used in these applications. Resolubility is a property, well known to the printing industry, whereby dry or drying polymer obtained from an aqueous or solvent based polymer composition is redispersible or redissolvable in that same composition when the latter is applied thereto. Resolubility is defined in more detail below. Resolubility is of great importance in the process of printing which generally involves applying the ink-formulation by various cylinders (smooth, engraved or flexo diches); these can become blocked with polymer by evaporation of the liquid medium (solvent and/or water) and/or the ink formulation can dry on the roller surface (e.g. during a short stoppage of the process for one reason or another) and this would obviously create problems when the process is restarted if the polymer were not resoluble.

Although the use of solvents such as ketones or solvents with a slower evaporation rate may be used to solve some of the problems, these solvents have other inherent issues such as safety and environmental issues as well as being slow to dry which can result in the solvent migrating into the packed material. Therefore the use of solvents with a faster evaporation rate is useful, although if they are too fast then printability failures may also occur.

There are also concerns with chlorine being given of during the incineration of packaging or RFID devices printed with polyvinyl chloride based inks and polyvinyl butyral based inks are associated with printing difficulties.

A method for overcoming such problems is to use a combination of binders where binders may be chosen to suit particular films. However a disadvantage with such an approach is that a large number of binders need to be prepared and stored for all the different types of inks that may be applied to the laminate films. Additionally if the various inks are not compatible with each other then extensive cleaning of the printing equipment would be required for each change over.

WO 04/069941 discloses a conductive composition comprising a metal flake and an adhesion promoting additive. WO 03/068874 discloses a conductive ink suitable for making printed conductive structures such as RFID antennae. Neither document teaches the use of a solvent borne polyurethane. WO 02/076724 discloses electrically conductive films containing nanotubes.

US 2004/0149959 discloses a method for making flakes of a conductive material from oligomeric release agents and a conductive-material precursor which may then be dispersed in a binder to form a conductive ink.

U.S. Pat. No. 4,443,495 discloses a heat curable conductive ink composition comprising an ethylenically unsaturated member.

U.S. Pat. No. 4,088,801 and U.S. Pat. No. 3,968,056 disclose a radiation curable ink suitable for making circuit boards.

A disadvantage of some prior art binders is that they often still require combining with several other binders, especially hard binders to get a good balance of properties such as for example adhesion, block resistance, flexibility, solvent retention, chemical resistances and resistance to sterilisation.

Surprisingly we have found that it is possible to prepare conductive inks comprising polyurethane binders that over-come many of the disadvantages of the prior art systems with a solvent based polyurethane system which is suitable as an ink for flexographic, gravure and ink jet printing processes on a broad range of substrates used in RFIDs and in flexible packaging film laminates and which are suitable for extrusion lamination.

The combination of the polyurethane binder and conductive material provides a compromise between good printing properties and good final conductivity but without having to use high temperature curing (which allows the use of substrates such as paper and plastic foils). Also good film properties may be obtained such as for example adhesion, flexibility and chemical resistances. The optional addition of a radiation curable material was found to give an additional improvement in film properties. An additional benefit may be an improvement in high speed printing capabilities.

Furthermore, compared to water-borne inks, which generally require the use of more hydrophilic i.e. water compatible binder or stabilisation material, solvent based polyurethanes optionally in combination with radiation curable materials may have much better chemical resistances and be more effective at retaining the conductive material, which may be of importance for food packaging applications.

According to invention there is provided a conductive ink comprising:
(a) 10 to 75 wt % of at least one solvent comprising ≦20 wt % water;
(b) 0 to 50 wt % of at least one radiation curable material having a Mn in the range of from 50 to 10,000 g/mol;
(c) 5 to 70 wt % of at least one polyurethane;
   (i) having a Mw in the range of from 4,000 to 70,000 g/mol;
   (ii) having 0 to 5 wt % of isocyanate-reactive component (s) bearing ionic or potentially ionic water-dispersing groups;
   (iii) having a free isocyanate group content <0.5 wt %;
(d) 20 to 85 wt % of a conductive material and
wherein (a), (b), (c) and (d) add up to 100%.

If (b) is present, then preferably the ratio of (b) to (c) is in the range of from 9/91 to 40/60 and most preferably from 14/86 to 35/65.

Preferably radiation curable includes UV curable and electron beam curable, most preferably radiation curable is UV curable.

Compared to laminating inks that are based on a higher Mw solvent borne polyurethane binder, the present invention offers an improved drying speed due to a higher attainable solids content and the combination of radiation curing and thermal drying which may result in higher line speeds being possible.

Preferably the conductive ink of the invention comprises 15 to 60 wt % and most preferably 20 to 50 wt % of solvent (a).

Preferably the solvent (a) comprises ≧75 wt %, more preferably ≧90 wt %, most preferably ≧98 wt % and especially 100 wt % of at least a fast evaporating solvent. Fast evaporating solvents are solvents having an evaporation rate of at ≧1.0, more preferably ≧1.4 and most preferably ≧1.6. Values for evaporation rates were published by Texaco Chemical Company in a bulletin Solvent Data: Solvent Properties (1990). (The values given are relative to the evaporation rate (ER) of butyl acetate which is defined as 1.00). Determination of evaporation rates of solvents that are not listed in the Texaco bulletin is as described in ASTM D3539. Fast evaporating solvents are particularly useful where fast drying times are required, especially when printing onto hydrophobic and non-absorbent substrates, for example plastics, metal and glass.

The solvent (a) is preferably selected from the group consisting of alcohols (such as ethanol, isopropanol, n-butanol, n-propanol, cyclohexanol); esters (such as ethyl acetate, propyl acetate, isopropyl acetate, butyl acetate); aromatic solvents (such as toluene); ketone solvents (such as acetone, methyl ethyl ketone, methyl isobutyl ketone, cyclohexanone, diacetone alcohol); aliphatic hydrocarbons; chlorinated hydrocarbons (such as $CH_2Cl_2$); ethers (such as diethyl ether, tetrahydrofuran); and mixtures thereof. Most preferably at least 70 wt %, more preferably at least 85 wt % and especially more than 98 wt % of the solvent (a) comprises a solvent selected from the group consisting of ethanol, isopropanol, ethylacetate and mixtures thereof. Preferably the solvent (a) comprises ≦10 wt % of water, more preferably ≦6 wt % and most preferably ≦1 wt % of water.

The radiation curable material of the invention composition may comprise one or more than one radiation curable material.

Preferably the radiation curable material (b) has a Mn in the range of from 220 and 7,000, more preferably 400 to 6,000, most preferably 500 to 5,200 and especially 550 to 3,500 g/mol.

Mn (number average molecular weight) and Mw (weight average molecular weight) herein when measured, are measured by Gel Permeation Chromatography (GPC), using THF as a solvent and polystyrene standards i.e. g/mol based on polystyrene standards.

Preferably the radiation curable material is cured with a radical mechanism. The radiation curable material when cured by a radical mechanism may also be initiated with a thermal initiator instead of a photoinitiator or with both. Use of a thermal initiator is commonly referred to as thermal curing.

The radiation curable material may comprise a wide variety of monofunctional or multifunctional materials. Preferably the radiation curable material has one, preferably two or more radiation polymerisable ethylenically unsaturated bonds which are capable of polymerisation. Preferably the radiation curable material has an average acrylate functionality in the range of from 1 to 6, more preferably 2 to 6 and most preferably 2 to 5.

Typical examples of such materials include but are not limited to epoxy (meth)acrylates; polyester (meth)acrylates; urethane (meth)acrylates; silicon (meth)acrylates; acrylated acrylics; mono- and multi-functional (meth)acrylate monomers; amine-(meth)acrylate adducts.

At the lower molecular weight range of the radiation curable material, the radiation curable material preferably comprises one or more monofunctional or multifunctional (meth) acrylate monomers, or amine-(meth)acrylate adducts.

Examples of monofunctional radiation curable material are: phenoxyethyl acrylate (PEA), isobornyl (meth)acrylate (IBOA and IBOMA), isooctyl acrylate (IOA), octyl and decyl acrylate, isodecyl acrylate (IDA), (ethoxylated) nonylphenol acrylate (NPEA), ethoxyethoxyethyl acrylate (EEEA), dicyclopentyloxyethyl (meth)acrylate (DCPEA and DCPEMA), tetrahydrofurfuryl (meth)acrylate (THFA and THFMA), beta-carboxyethyl acrylate (BCEA), acrylic acid, caprolactone (meth)acrylate, alkoxylated (meth)acrylate, glycerol (meth)acrylate, N-vinylpyrolidone, N-vinylformamide, N-vinylcaprolactam, styrene, dimethylacrylamide and silane monomers. Multifunctional (meth)acrylate monomers are for example (meth)acrylic acid esters of di- and tri-hydroxyl alcohols (e.g. polyethylene glycol, polypropylene glycol, aliphatic diols, neopentyl glycol, ethoxylated bisphenol A, trimethylolpropane, pentaerythritol, glycerol, di-trimethylolpropane, hydroxyl functional polyesters, dipentaerythritol and the ethoxylated, propoxylated and polycaprolactone analogues of all the above). Preferably such multifunctional materials are substituted and unsubstituted (meth)acrylates. Preferred examples are: (alkoxylated) neopentyl glycol di(meth)acrylate (NPGDA), (alkoxylated) trimethylolpropane tri(meth)acrylate (TMPTA and TMPTMA), (alkoxylated) pentaerythritol tri(meth)acrylate and tetra(meth)acrylate (PETA), 1,4-butanediol di(meth)acrylate (BDDA and BDDMA), 1,6-hexanediol di(meth)acrylate (HDDA and HDDMA), 2,2-dimethyl-3-hydroxypropyl-2,2-dimethyl-3-hydroxypropionate di(meth)acrylate, triethylene glycol di(meth)acylate (TEGDA and TEGDMA), tripropylene glycol di(meth)acrylate (TPGDA and TPGDMA), glycerol propoxylate triacrylate (GPTA), alkoxylated bisphenol A diacrylate, polyethyleneglycol di(meth)acrylate (PEGDA and PEGDMA), dipentaerythritol pentaacrylate (DPEPA), and the like.

Amine-(meth)acrylate adducts are those products prepared by the partial "Michael Type Addition" of primary and secondary amines to ethylenic unsaturation i.e. the double bond of (meth)acrylate containing compounds. Of particular interest here are the multi-functional (meth)acrylate monomers as mentioned below. Examples of amine-acrylate adducts are diethylamine modified trimethylolpropane triacrylate and ethanolamine modified ethoxylated trimethylolpropane triacrylate.

Epoxy (meth)acrylates are products formed by the reaction of (meth)acrylic acid with an epoxy(glycidyl) functional component e.g. aliphatic and aromatic containing epoxy resins, epoxidised oils, acrylic polymers and acrylic grafted polymers in which the acrylic component contains pendent epoxy groups. Some of the (meth)acrylic acid may be replaced by other acids, both ethylenically unsaturated and saturated, so as to impart specific properties e.g. aliphatic acids, fatty acids and aromatic acids. These products may alternatively be prepared by the reaction of a carboxylic acid functional component (e.g. polyesters and acrylic polymers) with a second component containing both epoxy groups and ethylenic unsaturation e.g. glycidyl (meth)acrylate.

Urethane (meth)acrylates are those products formed by the reaction of an isocyanate containing component with a hydroxyl containing component. At least one of these components must contain ethylenic unsaturation. Examples of isocyanate functional components are hexamethylene diisocyanate, isophorone diisocyanate, isocyanate functional acrylic polymers and polyurethanes, reaction products of hydroxyl functional components (e.g. polyethylene glycol, polypropylene glycol and di-, tri- and etc-hydroxy aliphatic alcohols (e.g. glycerol and trimethylolpropane) and their ethoxylated, propoxylated and polycaprolactone analogs) with di-, tri- and poly-isocyanates (e.g. hexamethylene diisocyanate, isophorone diisocyanate and toluene diisocyanate). Examples of hydroxy containing ethylenically unsaturated components are hydroxyethyl (meth)acrylate and its ethoxylated, propoxylated and polycaprolactone analogs as well as (meth)acrylated polyester polyols and (meth)acrylated polyether polyols.

Preferably the radiation curable material (b) is selected from the group consisting of bisphenol A epoxyacrylate, fatty acid modified bisphenol A acrylate, aliphatic epoxy (meth) acrylate, epoxy modified oil (meth)acrylate, polyester (meth) acrylate, urethane (meth)acrylate, acrylated acrylic, silicone acrylate, IBOA, IBOMA, PEA, TMPTA, alkoxylated TMPTA, TMPTMA, HDDA, alkoxylated HDDA, HDDMA, TPGDA, PETA, alkoxylated PETA, and mixtures thereof. These are all UV curable materials.

Preferably the conductive ink of the invention comprises 1 to 50 wt %, more preferably 1 to 40 wt % and most preferably 2 to 30 wt % of radiation curable material (b).

Preferably the viscosity of the radiation curable material (b) is $\leq 200$ Pa·s, more preferably $\leq 100$ Pa·s and most preferably $\leq 50$ Pa·s at 25° C.

The polyurethane (c) may comprise one or more than one polyurethane.

Preferably the Mw of the polyurethane (c) is in the range of from 5,000 to 65,000 and more preferably 6,000 to 55,000 g/mol.

Preferably the conductive ink of the invention comprises 5 to 50 wt % and more preferably 5 to 40 wt % of polyurethane (c).

For clarity, it is preferred that the polyurethane (c) is not radiation curable, although it may be possible for some of the higher Mw polyurethanes to have a degree of C=C double bonds that may be curable.

Preferably any polyurethane (c) with a weight average molecular weight (Mw) in the range of from 4,000 to 30,000 g/mol is essentially free of C=C double bonds.

Preferably any polyurethane (c) with a number average molecular weight (Mn) in the range of from 1,000 to 10,000 g/mol is essentially free of C=C double bonds. By essentially free is meant 0 to 0.1 mol of C=C double bonds per 100 g of polyurethane.

Preferably the PDi of the polyurethane (c) is in the range of from 1.3 to 10, more preferably 1.3 to 6 and especially 1.6 to 3.0. The polydispersity index (PDi) is defined as the weight average molecular weight (Mw) divided by the number average molecular weight (Mn).

In an embodiment of the invention the polyurethane (c) has an Mp in the range of from 10,000 to 35,000 g/mol, more preferably the Mp is in the range of from 13,000 to 32,000 g/mol, most preferably in the range of from 17,000 to 31,000 g/mol and especially in the range of from 19,000 to 30,000 g/mol.

The Mp is the molecular weight with the highest signal (i.e. the apex of the peak) in a chromatogram resulting from the measuring of the molecular weight using GPC with polystyrene as a standard and tetrahydrofuran as an eluent. Mp values are discussed in Modern Size Exclusion Liquid Chromatography, W. W. Yau, J. K. Kirkland and D. D. Bly, John Wiley & Sons, USA, 1997.

The polyurethane (c) of the invention composition preferably has a viscosity $\leq 18$ Pa·s, more preferably $\leq 12$ Pa·s and most preferably $\leq 6$ Pa·s at any solids content in the range of from 20 to 60 wt %, in a solvent comprising $\geq 70$ wt %, more preferably $\geq 90$ wt % and most preferably 100 wt % of at least one solvent having a molecular weight $\leq 105$ g/mol. All viscosities are measured according to ISO 2555-1989 at 25° C. Preferred solvents used to measure the viscosity of the polyurethane (c) in, include ethanol, isopropanol, n-propanol, ethyl acetate, propyl acetate and or mixtures thereof.

The polyurethane (c) is preferably obtained by the reaction of components comprising:
(i) 5 to 50 wt % of at least one polyisocyanate;
(ii) 0 to 20 wt % of at least one isocyanate-reactive component having a Mw in the range of from 50 to 200 g/mol;
(iii) 0 to 90 wt % of at least one isocyanate-reactive component having a Mw in the range of from 201 to 20,000 g/mol;
(iv) 0 to 95 wt % of at least one isocyanate-reactive component not comprised by (ii) or (iii);

(v) 0 to 40 wt % of at least one chain-extending and/or chain-terminating component not comprised by (i), (ii), (iii) or (iv);

where (i), (ii), (iii), (iv) and (v) add up to 100%;

in the presence of a solvent;

where the components comprise 0 to 5 wt % of isocyanate-reactive component(s) bearing ionic or potentially ionic water-dispersing groups.

The polyisocyanate component (i) may be an aliphatic polyisocyanate, an aromatic polyisocyanate or mixtures thereof.

The term aromatic polyisocyanate (for the sake of clarity) is intended to mean compounds in which all the isocyanate groups are directly bonded to an aromatic group, irrespective of whether aliphatic groups are also present. Examples of suitable aromatic polyisocyanates include but are not limited to p-xylene diisocyanate, 1,4-phenylene diisocyanate, 2,4-toluene diisocyanate, 2,6-toluene diisocyanate, 4,4'-methylene bis(phenyl isocyanate), polymethylene polyphenyl polyisocyanates, 2,4'-methylene bis(phenyl isocyanate) and 1,5-naphthylene diisocyanate. Preferred aromatic isocyanates include 2,4'-methylene bis(phenyl isocyanate) and 4,4'-methylene bis(phenyl isocyanate). Aromatic polyisocyanates provide chemical resistance and toughness but may yellow on exposure to UV light.

The term aliphatic polyisocyanate (for the sake of clarity) is intended to mean compounds in which all the isocyanate groups are directly bonded to aliphatic or cycloaliphatic groups, irrespective of whether aromatic groups are also present.

Examples include but are not limited to ethylene diisocyanate, para-tetra methylxylene diisocyanate (p-TMXDI), meta-tetra methylxylene diisocyanate (m-TMXDI), 1,6-hexamethylene diisocyanate, isophorone diisocyanate (IPDI), cyclohexane-1,4-diisocyanate and 4,4'-dicyclohexylmethane diisocyanate. Aliphatic polyisocyanates improve hydrolytic stability, resist UV degradation and do not yellow.

Preferred aliphatic iscocyanates include isophorone diisocyanate, 4,4'-dicyclohexylmethane diisocyanate and 1,6-hexamethylene diisocyanate.

Preferably at least 70 wt %, more preferably at least 85 wt % and most preferably at least 95 wt % of the polyisocyanate component (i) has two isocyanate groups.

Aromatic or aliphatic polyisocyanates which have been modified by the introduction of, for example, urethane, allophanate, urea, biuret, uretonimine and urethdione or isocyanurate residues may be used for component (i).

Preferably the polyurethane (c) comprises 4 to 30 wt % and more preferably 10 to 20 wt % of component (i).

The isocyanate-reactive components (ii) to (iv) will normally consist of a component bearing isocyanate-reactive groups which may also bear other reactive groups such as ionic (anionic and cationic) and non-ionic water dispersing groups. Isocyanate-reactive groups include groups such as such as —OH, —SH, —NH—, —NH$_2$, and —CHR$^1$—COOH where R$^1$ can be H, alkyl (more preferably C$_1$ to C$_8$ alkyl).

Examples of component (ii) include but are not limited to 1,4-cyclohexyldimethanol, ethylene glycol, propylene glycol, diethylene glycol, neopentyl glycol, 1,4-butanediol, 1,6-hexanediol, furan dimethanol, cyclohexane dimethanol, glycerol, trimethylolpropan, dimethylol propanoic acid (DMPA) and dimethylol butanoic acid (DMBA). DMPA and DMBA are examples of isocyanate-reactive components (ii) bearing anionic or potentially anionic water-dispersing groups.

Preferably component (ii) has an average of 1.8 to 2.5 isocyanate-reactive groups and more preferably component (ii) has two hydroxy functional groups.

Preferably the weight average molecular weight of component (ii) is in the range of from 62 to 200 g/mol and more preferably 84 to 200 g/mol.

Preferably the polyurethane (c) comprises 0 to 5 wt % and more preferably 0 to 3 wt % of component (ii).

Examples of component (iii) and (iv) include but are not limited to polyols such as polypropylene glycols, poly(propylene oxide/ethylene oxide) copolymers, polytetrahydrofuran, polybutadiene, hydrogenated polybutadiene, poysiloxane, polyamide polyesters, isocyanate-reactive polyoxyethylene compounds, polyester, polyether, polycaprolactone, polythioether, polycarbonate, polyethercarbonate, polyacetal and polyolefin polyols. Generally polyester polyols provide good weathering, good adhesion, improved chemical resistance and toughness; polyether polyols provide good flexibility and elasticity; polycaprolactone polyols provide improved weathering and better heat resistance than polyether polyols and better water resistance than adipate polyester polyols.

Polyester amides may be obtained by the inclusion of amino-alcohols such as ethanolamine in polyesterification mixtures. Polyesters which incorporate carboxy groups may be used, for example polyesters where DMPA and/or DMBA are used during the synthesis.

Polyether polyols which may be used include products obtained by the polymerisation of a cyclic oxide, for example ethylene oxide, propylene oxide or tetrahydrofuran or by the addition of one or more such oxides to polyfunctional initiators, for example water, methylene glycol, ethylene glycol, propylene glycol, diethylene glycol, cyclohexane dimethanol, glycerol, trimethylopropane, pentaerythritol or Bisphenol A. Especially useful polyether polyols include polyoxypropylene diols and triols, poly (oxyethyleneoxypropylene) diols and triols obtained by the simultaneous or sequential addition of ethylene and propylene oxides to appropriate initiators and polytetramethylene ether glycols obtained by the polymerisation of tetrahydrofuran. Particularly preferred are polypropylene glycols.

Preferably the weight average molecular weight of component (iii) is in the range of from 500 to 11,000 g/mol, more preferably 600 to 6,000 g/mol and especially 700 to 5,000 g/mol.

Components (iii) and (iv) may also include crosslinking groups. Crosslinking groups are well known in the art and include groups which crosslink at ambient temperature (20±3° C.) or at elevated temperatures up to 185° C., preferably up to 160° C. by a number of mechanisms including but not limited to Schiff base crosslinking (for example the reaction of carbonyl functional groups with carbonyl reactive amine and/or hydrazine functional groups), silane crosslinking (for example the reaction of alkoxy silane groups in the presence of water), amino-resin crosslinking, epoxy groups crosslinking with epoxy-reactive functional groups such as primary and/or secondary polyamines, hydrazides, dicyanamides, and polycarboxylic acids such as for example adipic acid and isophthalic acid, or isocyanate curing, where hydroxy or amine (primary or secondary) functional polyurethanes are combined with polyisocyanates. Usually the polyisocyanates are added shortly before application. Isocyanate crosslinking is most preferred, when crosslinking occurs during the application process.

Preferably the polyurethane (c) comprises 20 to 90 wt % and more preferably 60 to 90 wt % and especially 70 to 90 wt % of component (iii).

Preferably the polyurethane (c) comprises 0 to 6 wt % and more preferably 0 to 3 wt % and most preferably 0 wt % of component (iv).

Preferably polyurethane (c) comprises 0 to 5 wt %, more preferably 0 to 3 wt % and especially 0 to 1.5 wt % of isocyanate reactive component(s) bearing ionic or potentially ionic water-dispersing groups. This includes components (ii), (iii), (iv) and (v).

Component (v) is a chain-extending and/or chain-terminating component.

Examples of chain-terminating compounds include mono-alcohols, amino-alcohols, primary or secondary amines and mono-functional hydrazines as are well known in the art. Di- or poly-functional isocyanate-reactive compounds may be used as a chain-terminating compound if only one isocyanate-reactive group reacts under the given conditions. Examples of such difunctional compounds include mono-ethanol amine. The chain-terminating compound may also be a mono-functional isocyanate.

Examples of chain-extending compounds include amino-alcohols, primary or secondary diamines or polyamines such as ethylene diamine, propylene diamine and cyclic amines such as isophorone diamine and 4,4'-dicyclohexylmethane diamine; hydrazine and substituted hydrazines such as, for example, dimethyl hydrazine, 1,6-hexamethylene-bis-hydrazine, carbodihydrazine, hydrazides of dicarboxylic acids and sulphonic acids such as adipic acid dihydrazide, oxalic acid dihydrazide, isophthalic acid dihydrazide, hydrazides made by reacting lactones with hydrazine, bis-semi-carbazide, and bis-hydrazide carbonic esters of glycols; azines such as acetone azine, and or mixtures thereof. Another suitable class of chain-extending compounds are the so-called "Jeffamine" compounds with a functionality of 2 or 3 (available from Huntsman). These are PPO or PEO-based di or triamines, for example "Jeffamine" T403 and "Jeffamine" D-400. In a special embodiment where the prepolymer has isocyanate-reactive functional groups (such as hydroxyl groups) a chain-extending compound may also be a difunctional isocyanate.

Preferably the polyurethane (c) comprises 0.2 to 40 wt %, more preferably 0.7 to 25 wt %, especially 1 to 10 wt % and most especially 3 to 6 wt % of component (v).

The polyurethane (c) of the invention composition may be prepared conventionally by reacting a stoichiometric excess of the organic polyisocyanate (component (i)) with the isocyanate-reactive compounds (components (ii), (iii) and (iv)) under substantially anhydrous conditions at a temperature between about 30° C. and about 130° C., more preferably about 45° C. to about 85° C. until reaction between the isocyanate groups and the isocyanate-reactive groups is substantially complete to form an isocyanate-terminated prepolymer; preferably the reactants for the prepolymer are generally used in proportions corresponding to a ratio of isocyanate groups to isocyanate-reactive groups of from about 1.2:1 to about 2:1, more preferably from about 1.3:1 to 2.0:1 and most preferably 1.45:1 to 2:1. If desired, catalysts such as dibutyltin dilaurate and stannous octoate, zirconium or titanium based catalysts may be used to assist the polyurethane formation. Optionally no catalyst is added. Preferably no tin based catalyst is added. The catalyst, if used may be added immediately to a mixture of components (i) to (iv) or the mixture of components (i) to (iv) may be allowed to react for a period of time before the addition of a catalyst.

The reaction is usually carried out in the presence of an organic solvent to control the viscosity. Suitable organic solvents include but are not limited to acetone, tetrahydrofuran, ethyl acetate, methyl ethyl ketone, methyl isobutyl ketone and other solvents well known in the art. However it is preferred that solvents containing hydroxyl-functionality, such as ethanol or isopropanol should not be used during the early stages of the polyurethane synthesis as they may have a detrimental effect on the molecular weight build up.

During chain-extension, these solvents can be used, since the reaction of (di)amines with isocyanate groups is significantly faster than the reaction of isocyanate groups with hydroxyl groups.

If an isocyanate-terminated prepolymer is formed it is then reacted with a chain-extending and/or chain-terminating component (v). Preferably the reactants are used in proportions so that all isocyanate groups are reacted so that the resultant polyurethane (c) has a free isocyanate group content $\leq 0.5$ wt %, most preferably $\leq 0.01$ wt % and especially is so low that the isocyanate group content is no longer detectable using methods well known in the art. Alternately a hydroxyl-terminated prepolymer may be formed which is then reacted with a chain-extending and/or chain-terminating component (v).

The reaction between the components may be carried out in any order.

The conductive material (d) may be any known in the art and is preferably selected from the group consisting of conductive particulate materials, conductive flake materials, conductive needle materials, conductive fibres, conductive nanotubes and mixtures thereof.

Conductive material (d) may include highly conductive materials such as metals, metal alloys and metal coated compounds, and/or lower conductive materials, such as conductive carbon and metal oxides. For applications that require high conductivity, such as backscattered RFID devices, the conductive material is preferably selected from conductive metals such as silver, copper and nickel, and/or materials coated with conductive metal such as silver, copper and nickel. For applications that do not require high conductivity, such as capacitive RFID devices, the conductive material is preferably selected from carbon black, graphite, carbon fibres, carbon nanotubes, or conductive metal oxides such as antimony tin oxide and indium tin oxide and other materials, specifically particulate- or flake-like pigments or fillers, coated with antimony tin oxide and/or indium tin oxide.

Preferably the conductive material (d) is selected from silver particulate materials, silver flake materials, copper particulate materials, copper flake materials, silver coated particulate materials, silver coated flake like materials, silver coated fibres, silver coated nanotubes and mixtures thereof. Copper may also be used to coat particulate materials, flake materials, fibres and nanotubes.

Preferably, the conductive material (d) is silver or a silver coated material. Silver has the highest conductivity amongst conductive metals such as silver, copper, gold, aluminium and nickel. Furthermore, silver remains conductive when oxidised, whereas copper does not. Printed electronics like RFID antennae printed from silver based inks will therefore show a more stable level of conductivity and performance level over time as the metal is oxidised upon exposure to moisture and oxygen from the air, while those printed from copper based inks will not.

Silver coated materials such as silver coated copper, nickel or glass, are of special interest because they may result in a reduced material cost. Furthermore, compared to pure silver materials, some silver coated materials such as silver coated glass may exhibit a reduced density which may offer additional cost reductions. However silver coated copper or nickel materials have a density that is comparable to pure silver. Preferably silver coated materials are selected from silver coated copper materials, silver coated nickel materials, silver coated glass materials, silver coated fibres, silver coated nanotubes and mixtures thereof.

Conductive material (d) if a particulate material may be silver nanoparticles or silver coated nanoparticles. Nanoparticles are defined herein as particles with an average particle size below 1 micrometer, more preferably below 0.5 micrometer and most preferably below 0.2 micrometer. Nanoparticles may be of particular interest for ink jet printing applications to be able to maintain low ink viscosities even with a very high conductive material content. This may also prevent blocking of printing nozzles. Moreover, the use of silver nanoparticles or silver coated nanoparticles may offer a strong reduction of the metal sintering temperature, meaning that improved conductivity may be obtained at temperatures below 200° C. Conductive nanoparticles and/or nanotubes may also be of interest for transparent conductive coatings and/or adhesives, provided that the nanoparticles are sufficiently small and homogeneously dispersed within the dried ink layer. Transparent conductive coatings could be used to for example prepare transparent RFID antennae, potentially offering an advantage of minimal colour interference with desired package graphics, which implies that the RIFD antenna does not have to be separately printed on the reverse side of the package graphics as is traditionally the case.

Preferably the conductive material (d) comprises a mixture of conductive flake and conductive particle materials, where the weight ratio of particulate material to flake material preferably ranges from 1:5 to 5:1.

Conductive materials with a higher aspect ratio, such as conductive flake, fibre or nanotube materials, are likely to give a lower percolation threshold. The percolation threshold is the point where the conductive materials in the film come into contact; this is reached at a certain volume level of conductive material which is strongly dependent on the aspect ratio. The aspect ratio is defined as the ratio between the material length and its respective thickness or diameter. For example the percolation threshold for silver particles is around 80 wt % based on total solids in the film (which corresponds to about 28 volume %), whereas for carbon nanotubes the percolation threshold may already be at a few wt %. When the percolation point is reached, the resistivity level of the dry film strongly decreases and levels off even with further increases in conductive material loading.

Preferably the aspect ratio of conductive flake material is at least 2:1, preferably at least 5:1, more preferably at least 10:1. Preferably the aspect ratio of carbon fibres is in the range of from 15:1 to 1,000:1. Preferably the aspect ratio of carbon nanotubes is in the range of from 500:1 to 5,000:1. A fibre is generally not hollow and typically has a thickness in the order of a few 100 nm to around 500 nm and a carbon nanotube is generally hollow and typically has a thickness in the order of a few nm to around 100 nm.

The ratio of conductive material to the binder material ((b)+(c)) will depend on the type of conductive material used and the desired level of conductivity. If the levels of conductive material are too low, any resultant conductivity is likely to be too low and if the levels of conductive material are too high properties like e.g. film strength/cohesion, adhesion and printability may be negatively affected.

Preferably the weight ratio of conductive material (d) to total binder material (b)+(c) is in the range of from 0.01:99.99 to 85:15.

If $\geq 80$ wt % based on the weight of conductive material (d), of nanotubes and/or fibres are used as a conductive material (d) then the weight ratio of conductive material (d) to total binder material (b)+(c) is preferably in the range of from 0.01:99.99 to 20:80.

If $\geq 80$ wt % based on the weight of conductive material (d), of carbon nanotubes are used as a conductive material (d), then the weight ratio of conductive material (d), to total binder material (b)+(c) is preferably in the range of from 0.01:99.99 to 25:75 and more preferably from 0.1:99.9 to 14:86.

If $\leq 20$ wt % based on the weight of conductive material (d), of nanotubes and/or fibres are used a conductive material (d) then the weight ratio of conductive material (d) to total binder material (b)+(c) is preferably in the range of from 20:80 to 90:10 and more preferably 30:70 to 85:15.

If $\geq 80$ wt % based on the weight of conductive material (d), of silver particulate or flake material is used as a conductive material (d) then the weight ratio of the conductive material (d) to total binder material (b)+(c) is preferably in the range of from 40:60 to 90:10 and more preferably from 50:50 to 85:15.

If $\geq 80$ wt % based on the weight of conductive material (d), of silver coated particulate or silver coated flake materials with strongly reduced density compared to pure silver (like for example silver coated glass) is used as a conductive material (d) then the weight ratio of the conductive material (d) to total binder material (b)+(c) is preferably in the range of from 20:80 to 80:20 and more preferably from 30:70 to 70:30.

If $\geq 80$ wt % based on the weight of conductive material (d), of carbon black, graphite, carbon fibres, or conductive metal oxides such as antimony tin oxide or indium tin oxide are used as a conductive material (d) then the weight ratio of the conductive material (d) to total binder material (b)+(c) is preferably in the range of from 2:98 to 60:40 and more preferably from 5:95 to 40:60.

The final conductivity also depends on other parameters, such as for example the type of conductive material used, the printing technique, layer thickness, the drying or cure conditions (e.g. temperature, time) and type of substrate.

According to a preferred embodiment of the present invention there is provided a conductive ink comprising:
  (a) 10 to 75 wt % of at least one solvent comprising $\leq 1$ wt % of water;
  (b) 0 to 50 wt % of at least one radiation curable material:
    (i) having a Mn in the range of from 550 to 3500 g/mol;
    (ii) having an average acrylate function in the range of from 2 to 5;
  (c) 5 to 70 wt % of at least one polyurethane:
    (i) having a Mw in the range of from 6,000 to 55,000 g/mol;
    (ii) having 0 to 5 wt % of isocyanate-reactive component(s) bearing ionic or potentially ionic water-dispersing groups;
    (iii) having a non-detectable free isocyanate group content;
    (iv) having 0 to 0.1 mol of C=C bonds per 100 g; and
  (d) 20 to 85 wt % of a conductive material selected from silver particulate materials, silver flake materials, copper particulate materials, copper flake materials, silver coated particulate materials, silver coated flake like materials, silver coated fibres, silver coated nanotubes and mixtures thereof;
and wherein (a), (b), (c) and (d) add up to 100%.

If (b) is present, then preferably the ratio of (b) to (c) is in the range of from 14/86 to 35/65.

In a preferred embodiment of the invention, crosslinking occurs during or after the application process by using a combination of blocked isocyanate groups and hydroxyl groups. Blocked isocyanate groups, for example blocked with methyl ethyl ketone-oxime (MEK-oxime), can deblock at elevated temperature after application and can then react with a hydroxyl functional group at the elevated temperature. The blocked isocyanate functionality may be present on the polyurethane (c), the optional radiation curable material (b) and/or on an additional component. The blocked isocyanate functionality may be obtained for example by the reaction of an isocyanate functional polyurethane with a blocking agent such as MEK-oxime, phenol, (substituted) imidazole and caprolactam. The co-reactive hydroxyl-functionality may be present on the polyurethane (c), the optional radiation curable material (b) and/or on an additional component. Examples of hydroxyl functional radiation curable materials are glyceryl dimethacrylate (GDMA) and pentaerythritol triacrylate (PETA).

In a preferred embodiment of the invention the conductive ink is applied to a substrate and a drying profile is carried out which comprises the steps:
(i) pre-drying (flash-off) at 70 to 200° C. from 5 seconds for up to 5 minutes; and
(ii) drying at 80 to 200° C. for 5 to 60 minutes, more preferably 10 to 30 minutes.

Most preferably a combination of the drying profile described above and crosslinking using blocked isocyanate groups is used to cure the conductive ink of the invention.

The conductivity of the printed material is determined by measuring the surface resistivity. The surface resistivity of a printed conductive material may be determined according to the method disclosed in ASTM F1896-98. In this test method, the electrical resistance across the top layer of a test strip of printed and dried or cured conductive material is measured using an ohm meter. The surface resistivity is expressed in Ohms per square and is calculated by dividing the measured resistance by the number of squares, where the number of squares is determined by dividing the length of a printed conductive circuit by its width. The resistivity strongly depends on the type of conductive material. Especially for highly conductive materials the measured resistance across the top layer of the printed ink layer will also depend on the layer thickness, which depends in turn on the printing technique: screen printing typically results in a 25 micron dry layer, whereas flexographic and gravure printing typically result in a <20 micron dry layer, more preferably in a <15 micron dry layer and most preferably in a <10 micron dry layer. The surface resistivity is therefore preferably reported either as Ohms per square per mil (1 mil=25 microns) or in Ohms per square if the thickness is given.

When highly conductive materials such as metals are used as conductive material (d) in the ink the surface resistivity of the dry ink layer is preferably <5 Ohms per square, more preferably <1.5 Ohms per square and most preferably <0.5 Ohms per square at a dry layer thickness of 2 to 10 microns. When less conductive materials are used as conductive material (d) the surface resistivity of the dry ink layer is preferably <$10^3$ Ohms per square at a dry layer thickness of 2 to 20 microns.

In a special embodiment the conductive ink of the invention contains conductive particles than can be ordered in the film as taught in U.S. Pat. No. 5,061,551 using a magnetic field applied to the film, which may result in an improved level of conductivity at lower loadings of conductive material.

In another embodiment a resultant film from the composition of the invention containing nanotubes is treated with high energy flashlight or with microwaves to connect the tubes and enhance the conductivity level of the film.

Preferably the conductive ink of the invention has a solids content in the range of from 25 to 85 wt % and more preferably 40 to 85 wt % and most preferably 45 to 75 wt %.

Preferably the conductive ink of the invention has a resolubility within 30 seconds, more preferably within 20 seconds and most preferably within 10 seconds.

The conductive ink of the invention preferably has a viscosity in the range of from 50 to 1,000 and more preferably 100 to 500 mPa·s at 20° C.

The conductive ink of the invention may be used directly or in combination with, for example, defoamers, anti-oxidants, corrosion inhibitors, bacteriocides, viscosity modifiers, fillers, waxes, anti-settling agents, dispersing agents, additional binders and/or colorants.

Additional binders include binders selected from vinyl polymers, polyester polymers, nitrocellulose and mixtures thereof.

Anti-settling agents may be especially useful if metal powders such as for example silver particles are used as these may have the tendency to settle. Suitable examples of anti-settling agents include Antisettle CVP (Cray Valley) and DISPERBYK (BYK Chemie).

The conductive material (d) is preferably dispersed by the binder materials (b) and/or (c) present in the ink composition or by additional resins such as nitrocellulose resin or by the use of suitable dispersing agents for example ethoxylated phosphate surfactants and commercially available dispersants such as for example Solsperse 20000, Solsperse 24000 (both from Avecia Additives), DISPERBYK-182 (BYK Chemie).

Colorants include dyes, pigments or mixtures thereof. The pigment may be any conventional organic or inorganic pigment such as titanium dioxide, iron oxide or any coloured pigments well known in the art. The dyes may be any conventional dyes selected from acid dyes, natural dyes, cationic or anionic direct dyes, basic dyes and reactive dyes.

Preferably the conductive ink comprises 0 to 50 wt %, more preferably 0 to 40 wt % and most preferably 0 to 35 wt % of colorant by weight of the conductive ink.

The conductive ink may be used in a number of printing processes including flexographic and/or gravure and/or ink jet printing processes. Preferably the printing process is a flexographic and/or gravure printing process. Alternatively the conductive ink is used in an ink jet printing process, in particular in combination with silver and/or silver coated nanoparticles. For ink jet applications the viscosity of the ink is preferably below 50 mPa·s at 20° C., most preferably below 30 mPa·s at 20° C. and the solids content of the ink is preferably in the range of from 5 to 30 wt %.

In a further embodiment of the present invention there is provided a process for printing an image on a substrate comprising applying thereto a conductive ink according to the present invention. The conductive ink of the invention may be printed on a range of substrates including paper and polyethylene terephthalate (PET), more preferably PET.

The conductive ink of the invention may be used to make a range of articles printed with the ink including printed circuit boards, planar and contoured antennae, capacitive RFID antennae, backscattered RFID antennae, electrostatic detection devices, packages including RFID tags, and articles having printed anti static solid areas or arrays of the composition.

In a further embodiment of the present invention there is provided a conductive layer with a thickness in the range of from 2 to 20 microns, (more preferably 2 to 15 microns) and a surface resistivity <1.5 Ohm per square obtained from a conductive ink composition which is applied to a substrate (for example PET) and dried with a drying profile comprising the steps:
(i) pre-drying (flash-off) at 70 to 200° C. from 5 seconds for up to 5 minutes; and
(ii) drying at 80 to 200° C. for 5 to 60 minutes, more preferably 10 to 30 minutes, the conductive ink composition comprising:
- (a) 10 to 75 wt % of at least one solvent comprising ≦1 wt % of water;
- (b) 0 to 50 wt % of at least one radiation curable material:
  - (i) having a Mn in the range of from 550 to 3500 g/mol;
  - (ii) having an average acrylate function in the range of from 2 to 5;
- (c) 5 to 70 wt % of at least one polyurethane:
  - (i) having a Mw in the range of from 6,000 to 55,000 g/mol;
  - (ii) having 0 to 5 wt % of isocyanate-reactive component(s) bearing ionic or potentially ionic water-dispersing groups;
  - (v) having a non-detectable free isocyanate group content;
  - (vi) having 0 to 0.1 mol of C=C bonds per 100 g; and
- (d) 20 to 85 wt % of a conductive material selected from silver particulate materials, silver flake materials, copper particulate materials, copper flake materials, silver coated particulate materials, silver coated flake like materials, silver coated fibres, silver coated nanotubes and mixtures thereof;

and wherein (a), (b), (c) and (d) add up to 100%.

If (b) is present then preferably the ratio of (b) to (c) is in the range of from 14/86 to 35/65.

In another embodiment of the invention there is provided an RFID antenna comprising a printed layer of a conductive ink according to the invention.

The invention will now be described by example only. All parts and percentages are by weight unless specified otherwise.

Tests:

Electrical Resistivity

Electrical resistivity of printed films was determined according to ASTM F1896-98. To determine the electrical resistivity an ink layer was applied on polyethylene terephthalate (PET) using a 12 micron wire rod. After the film was dried and/or cured according specified condition a test strip of 0.2 cm by 10 cm was cut out. The probes of an ohm meter (Metra Hit 22S) were placed at either ends of the coated strip covering the complete width of the strip and the resistance was measured in ohms (where X=resistance too high to be measured (>40 MOhm)). The surface resistivity (ohm per square) was then calculated by dividing the obtained value by the number of squares of the test strip. The number of squares is given by the ratio of the strip length in between the electrodes (L) and the width of the strip (W). The average layer thickness of the dry conductive layer was then determined by subtracting the measured total strip thickness with the measured substrate thickness, where each value was determined from a three point measurement across the test strip. Layer thickness measurements were performed using an Erichsen 497 measuring device.

The surface resistivity of the composition in example 2 was determined as follows:

Application of ink composition: 12 micron (wire rod) wet on 100 microns thick PET film
Applied drying condition: 10 seconds at 80° C. and an additional 30 minutes at 150° C.
Measured resistivity of test strip; 16 ohm
Measured dimensions of test strip: length (L)=8.63 cm; width (W)=0.20 cm
Number of squares: L/W=43
Surface resistivity: 16 ohm/43 squares=0.4 ohm per square
Average dry layer thickness determined at 2.3 microns.

The volume resistivity is the surface resistivity in ohm per square multiplied by the thickness of the coating in cm.

Dry Wrinkle Test

A 12 μm thick wet film formulation was cast onto Corona treated white polyethylene (LDPE) film available from Oerlemans Plastics BV (Genderen, NL). This was dried for 10 seconds at 80° C. and then at least one day (to maximum of five days) at room temperature (20 to 25° C.). The dried film is folded for at least five times (in a concertina fashion) and wrinkled for 10 seconds. The sensitivity towards dry wrinkle is assessed by determining the degree of coating damage (5=very good: coating is undamaged; 1=very poor: formulation is completely removed).

Wet Wrinkle Test

The wet wrinkle test proceeds according the dry wrinkle test, only that in this case the dried film is placed for 20 minutes in a beaker filled with cold water, where after the wrinkle test is immediately performed. The wrinkling is performed for 10 seconds under cold water.

Resolubility

The composition of the invention or the formulated ink was cast onto a test card and dried for 1 hour at room temperature. A drop of the same ink formulation was put on the dried film. After a period of time (e.g. 5 seconds), the drop was removed with a wet tissue. This period of time was then increased until the dried film was completely redissolved by the drop i.e. resolubility of the formulation had occurred and the time needed to completely resolubilise the formulation was measured.

Block Resistance

The degree of blocking of a coating against the same coating lacquer to lacquer (UL) or lacquer to backside of the substrate (L/B) was assessed with a Koehler Block tester (ex Instrument Company Inc.). The blocking resistance of dried films (10 seconds at 80° C.) is measured after 16 hours in an oven at 52° C. under a pressure of 1 kg/cm².

Printed substrates (with a 12 μm wet coating of the composition of the invention) were cut into small pieces of 30×100 mm and folded twice so that lacquer against lacquer and lacquer against substrate backside was tested. The degree of blocking was determined on the ease of pulling the two test specimens apart and assessing the coating for any damage. (5 very good: entirely separated and undamaged. 4 fair: some sticking hardly any damage. 3 mediocre. 2 poor. 1 very poor: stuck together; once pulled apart, they are both completely damaged.)

Adhesion

A self adhesive tape (Sellotape™ 25 mm from Henkel Consumer Adhesives or Scotch™ tape 20 mm from 3M) was applied under uniform pressure onto a printed ink layer on a substrate immediately after drying of the layer and torn off the substrate immediately thereafter. The quantity of the print adhered to the tape was classified with a scale from 0 to 5, where 0 means more than 95% of the printed layer adhered to the tape, 1 means more than 50% of the layer adhered to the tape, 2 means less than 30%, of the printed layer adhered to the tape, 3 means less than 20% of the printed layer adhered to the tape, 4 means less than 10% of the printed layer adhered to the tape and 5 means less than 2% of the printed film adhered to the tape.

Substrates that may be used for this test are:
MB 400, co-extruded bioriented polypropylene (Mobil)
PET foil PASD 0.10 mm (from SIHL Benelux)
PE-white (LDPE, from Oerlemans Plastics BV, Genderen NL), which was corona treated with a Vetaphone ET-1, 300 W at 15 m/min and about 2 mm distance between the substrate and the corona-treater.

Chemical Resistance Test

A 12 μm thick wet film formulation was cast onto a Leneta test card and dried for 10 seconds at 80° C. and then for at least 2 hours at approximately 20° C. A small piece of cotton wool was placed on the dried film, which was then soaked with the test liquid, such as demineralised water, alcohol/water (70/30) mixture, coffee or squalane. The soaked pieces of cotton wool were then covered by a petri-dish to prevent drying out. After 16 hours the pieces of cotton wool and residual liquid were removed and the degree of coating damage was determined (5=very good: no visible damage or degradation/discoloration; 4=only slight visible damage or haze/blooming; 3=clear haze/blooming or damage; 2=coating partially dissolved; 1=very poor: coating is (almost) completely dissolved).

Gloss

A 12 μm thick wet film formulation was cast onto a Leneta test card and dried for 10 seconds at 80° C. and then for at least a 2 hours at approximately 20° C. The gloss level of the dried film was determined using a Byk Gardner micro-TRI-gloss device set at an angle of 20 degrees or 60 degrees.

Components Used:

NeoRez U-347=available from DSM NeoResins BV, is a non-reactive aromatic polyurethane with an average molecular weight of Mn=3500 g/mol and Mw=8,500 g/mol and a solids content of 75% (volatiles: 22.5% ethyl acetate, 2.5% ethanol). Viscosity Brookfield (25° C.): 1100 mPa·s. The Mp is 4,800 and the PDi is 2.43.

The wt % of isocyanate reactive components bearing ionic or potentially ionic water dispersion groups used to make NeoRez U-347 was 0%. There was no detectable isocyanate group content. The level of C=C bonds per 100 g was 0 mol.

NeoCryl B-817=available from DSM NeoResins BV, is a solid acrylic copolymer with a molecular weight of Mw=23,000

NeoCryl B-842=available from DSM NeoResins BV, is a solid methacrylic polymer with a molecular weight of Mw=110,000.

Craynor CN104=available from Cray Valley, is a bisphenol A epoxyacrylate (100%). Average molecular weight Mn=900 g/mol and the viscosity is 18 Pa·s at 50° C. and the functionality is 2.

Ebecryl 8210=available from Cytec Surface Specialties, is an aliphatic acrylated polyurethane (100%). Average molecular weight Mn=600 g/mol and the viscosity is 4,500 mPa·s at 25° C. and the functionality is 4.

Irgacure 819=photoinitiator used as 10% in ethyl acetate/ethanol (3/1). Photoinitiator is available from Ciba.

Nitrocellulose 3,5 DLX=used as 34% in ethyl acetate/ethanol (3/1). Available from ICI.

PVB=polyvinyl butyral, is a solid resin available as Pioloform BL 18 from Wacker Chemie.

Silver flake powder=5-8 microns×5-8 microns×50 to 800 nm pure silver flake powder available from Nanoamorphous & Structured Materials, USA. The aspect ratio=L/T, with L=5 to 8 microns (average 6.5), T=0.05 to 0.8 microns (0.4 microns) so the aspect ratio=6.5/0.4=16.

Silver particle powder=0.6 to 1.6 microns pure silver particle powder is available from Nanoamorphous & Structured Materials, USA.

VCHM=UCAR™ VMCH Solution Vinyl Resin is a high molecular weight, carboxy-functional terpolymer comprised of vinyl chloride, vinyl acetate and maleic acid. It is supplied by Dow as a powder.

Silver Paste #1

A silver paste was prepared by mixing silver flake powder (72 wt %), nitrocellulose 3,5 DLX (9 wt %), ethyl acetate/ethanol (3/1 wt) using a high speed mixer (10 minutes at 6500 rpm). The solids content of the silver paste #1 was determined experimentally as being 79 wt %.

EXAMPLES C1, 2, C3, 4 & 5

Compositions of the invention (Examples 2, 4 and 5) and comparative compositions (Comparative examples C1 and C2) were prepared by mixing the components as shown below in Table 1. NeoRez U-347 and NeoCryl B-817 were diluted to 45% with ethyl acetate/ethanol (3/1 wt) after which they were hand mixed with the nitrocellulose 3,5 DLX into the silver paste. Extra solvent (ethyl acetate/ethanol (3/1 wt)) was added to allow application as a film with a 12 microns wire rod (final solids content is given in Table 1). The compositions containing radiation curable material (Examples 4 and 5) were subsequently UV cured using 2×300 mJ/cm$^2$ at 420 nm. Prior to testing the films were left at room temperature (23+/−3° C.) for at least an hour.

All examples were found to have a resolubility of <5 seconds. All examples had a block resistance of 4 or 5.

All of the obtained films were examined for gloss, adhesion, chemical resistances, dry wrinkle, wet wrinkle and surface resistivity. Test results are given below in Table 2.

TABLE 1

| | Example | | | | |
|---|---|---|---|---|---|
| Components (wt %) | C1 | 2 | C3 | 4 | 5 |
| NeoRez U-347 | 0 | 9.6 | 0 | 7 | 7 |
| Nitrocellulose 3,5DLX | 23.1 | 3.1 | 3.2 | 0 | 0 |
| NeoCryl B-817 | 0 | 0 | 7.3 | 0 | 0 |
| Silver paste #1 | 76.9 | 80.9 | 80.6 | 81.8 | 81.8 |
| Craynor CN104 | 0 | 0 | 0 | 3.3 | 0 |
| Ebecryl 8210 | 0 | 0 | 0 | 0 | 3.3 |
| Irgacure 819 | 0 | 0 | 0 | 3.3 | 3.3 |
| Ethyl acetate/ethanol (3/1 wt) | 0 | 6.5 | 8.9 | 4.6 | 4.6 |
| Total | 100 | 100 | 100 | 100 | 100 |
| Final solids % | 60-65 | 71 | 63 | 65-75 | 65-75 |

TABLE 2

| | Example | | | | |
|---|---|---|---|---|---|
| | C1 | 2 | C3 | 4 | 5 |
| Gloss | | | | | |
| 20° | 7 | 8 | 6 | 7 | 7 |
| 60° | 32 | 38 | 32 | 36 | 32 |
| Adhesion | (Sellotape ™ 25 mm/Scotch ™ tape 20 mm) | | | | |
| PE-white | 2/2 | 4/4 | 2/3 | 3-4/3-4 | 4/4 |
| MB 400 | 1/1 | 3/3 | 2/3 | 3/3 | 3/3 |
| PET | 1/1 | 3/3 | 2/4 | 4/4 | 4/4 |
| Chemical resistances | | | | | |
| Demineralised water | 3 | 4-5 | 3 | 4-5 | 5 |
| Ethanol/water (30/70) | 2 | 4 | 2 | 4-5 | 4-5 |
| Coffee | 4 | 4 | 4 | 4-5 | 4-5 |

TABLE 2-continued

|  | Example | | | | |
|---|---|---|---|---|---|
|  | C1 | 2 | C3 | 4 | 5 |
| Dry wrinkle (PE-white) | 3 | 4 | 3-4 | 5 | 4 |
| Wet wrinkle (PE-white) | 2 | 3 | 2 | 3-4 | 4 |
| Surface resistivity (ohm/square) | | | | | |
| drying profile* | 23 [4.7]# | 0.4 [2.3]# | 1.9 [4.7]# | 1.4 [3.0]# | 1.3 [2.7]# |

*10 seconds at 80° C. and 30 minutes at 150° C.
[average layer thickness in microns]

Silver Paste #2

A silver paste was prepared by mixing silver flake powder (52 wt %), silver particle powder (26 wt %), nitrocellulose 3,5 DLX (2.3 wt %), ethyl acetate/ethanol (3/1 wt, 19.7 wt %) using a high speed mixer (10 minutes at 10000 rpm). The solids content of the silver paste #2 was determined experimentally as being 80 wt %.

Silver Paste #3

A silver paste was prepared by mixing silver flake powder (50 wt %), silver particle powder (25 wt %), VMCH (19% in Ethyl acetate/ethanol 3/1 wt, 4 wt %), ethyl acetate/ethanol (3/1 wt, 21 wt %) using a high speed mixer (10 minutes at 10000 rpm). The solids content of the silver paste #3 was determined experimentally as being 83 wt %.

EXAMPLES 6 TO 9

Silver based inks were prepared from mixing in by hand the following ingredients as shown in Table 3 below. If needed the binders were first diluted with part of the EtAc/EtOH (3/1), after which these were mixed together with the other ingredients into the silver paste. The remainder of the EtAc/EtOH (3/1) was added to obtain a desirable viscosity level for application with a 12 microns wire rod (final solids given in Table 3). The formulations were applied on various substrates (cardboard, PET, PE-white, MB-400) using a 12 microns wire rod. Directly after application the wet films were dried. The UV-oligomer containing formulation (Example 7) was subsequently UV cured using the following conditions: 2×300 mJ/cm$^2$ at 420 nm. Prior to testing the films were left at room temperature (approx. 23° C.) for at least one hour.

The obtained films were examined for gloss, adhesion, block resistance, chemical resistances, dry wrinkle, wet wrinkle and reversibility. Electrical resistivity (surface and volume) of the printed films (after an extra drying period) was determined according ASTM test method F1896-98.

All examples were found to have a resolubility of <5 seconds. All examples had a block resistance of 4 or 5.
Test results are given in Table 4 below.

TABLE 3

|  | Example | | | |
|---|---|---|---|---|
| Components (wt %) | 6 | 7 | C8 | C9 |
| Silver paste #2 | 64.3 | 69.1 | 57.4 | 0 |
| Silver paste #3 | 0 | 0 | 0 | 41.8 |
| Nitrocellulose 3,5DLX | 7.2 | 0 | 0 | 0 |
| NeoRez U-347 | 7.9 | 8.2 | 0 | 0 |
| Ebecryl 8210 | 0 | 2.6 | 0 | 0 |
| PVB | 0 | 0 | 5 | 0 |
| NeoCryl B-817 | 0 | 0 | 5.3 | 0 |
| NeoCryl B-842 | 0 | 0 | 0 | 12.6 |

TABLE 3-continued

|  | Example | | | |
|---|---|---|---|---|
| Components (wt %) | 6 | 7 | C8 | C9 |
| VMCH | 0 | 0 | 0 | 7.9 |
| Irgacure 819 | 0 | 2.8 | 0 | 0 |
| Ethyl acetate/ethanol (3/1 wt) | 21.5 | 17.3 | 32.3 | 37.7 |
| Total | 100 | 100 | 100 | 100 |
| Final solids % | 58 | 65 | 59 | 43 |

TABLE 4

|  | Example | | | |
|---|---|---|---|---|
|  | 6 | 7 | C8 | C9 |
| Gloss | | | | |
| 20° | 4 | 4 | 2 | 5 |
| 60° | 17 | 16 | 8 | 20 |
| Adhesion | (Sellotape ™ 25 mm/Scotch ™ tape 20 mm) | | | |
| PE-white | 4/4 | 4/4 | 3-4/3-4 | 2/1 |
| MB 400 | 4/4 | 3/4 | 3-4/3-4 | 1/0 |
| PET | 4/5 | 4/4-5 | 3-4/4 | 2/2 |
| Chemical resistances | | | | |
| Demineralised water | 5 | 4-5 | 4-5 | 4 |
| Ethanol/water (30/70) | 4 | 4-5 | 4 | 3 |
| Coffee | 4 | 4 | 5 | 4 |
| Dry wrinkle (PE-white) | 4 | 3 | 4 | 4 |
| Wet wrinkle (PE-white) | 4 | 3 | 1 | 1 |
| Surface resistivity (ohm/square) | | | | |
| drying profile$^1$ | 0.36 [7]# | 6.0 [7]# | 0.46 [8]# | 94 [6]# |
| drying profile$^2$ | 0.09 [7]# | 0.29 [7]# | 0.14 [8]# | 0.30 [6]# |
| Volume resistivity (ohm-cm) | | | | |
| drying profile$^1$ | 2.5 × 10$^{-4}$ | 4.2 × 10$^{-3}$ | 3.7 × 10$^{-4}$ | 5.6 × 10$^{-2}$ |
| drying profile$^2$ | 6.4 × 10$^{-5}$ | 2.0 × 10$^{-4}$ | 1.2 × 10$^{-4}$ | 1.8 × 10$^{-4}$ |

$^1$10 seconds at 80° C. and 10 minutes at 80° C., 24 μm wet film on PET
$^2$10 seconds at 80° C. and 30 minutes at 150° C., 24 μm wet film on PET
[average layer thickness in μm]

Printability

An indication of printability properties was obtained using a K-control coater type K-101 with an anilox application device. The printability of the ink was indicated by assessing the rheology of the applied dry ink layer (ink flow behaviour and ink layer appearance), wetting behaviour on the selected substrate and ink transfer from the anilox onto the rubber roller which was used to print the ink onto the substrate.

The overall printability on an untreated polyethylene film was determined using a scale from 0 to 5, with 5 being the best result. The results are shown below in Table 5 below.

Cob Webbing

An indication of printability properties was obtained from a cob webbing test. It is indicative as cob webbing is dependent on inter alia the viscosity and the drying conditions Using a pipette five drops of the silver ink compositions were put onto clean polyethylene film. The drops were cast immediately with a flexographic hand roller which was rolled 5 times (up and down), under a spot suction. The cob webbing tendency was observed during the application.

After 5 minutes, the appearance of the ink applied onto the polyethylene film was judged with respect the amount of ink which is removed from the substrate, indicating different evolution of tack among the versions. The results are shown below in Table 5.

The scale used was 0 to 5, with 5 being the best result.

TABLE 5

| Example | Cob webbing | Printability (Wetting/Ink Transfer) |
|---|---|---|
| C1 | 3-4 | 5/3-4 |
| 2 | 3-4 | 5/4 |
| C3 | 4 | 5/4 |
| 4 | 3-4 | 5/3-4 |
| 5 | 3-4 | 5/4 |
| 6 | 2-3 | 5/4 |
| C8 | 2-3 | 5/3 |
| C9 | 1 | 5/3 |

The invention claimed is:

1. A conductive ink comprising:
   (a) 10 to 75 wt % of at least one solvent comprising $\leq$20 wt % water, wherein the at least one solvent (a) comprises $\geq$75 wt % a solvent having an evaporation rate $\geq$1.0;
   (b) 0 to 50 wt % of at least one radiation curable material having a Mn in the range of from 50 to 10,000 g/mol;
   (c) 5 to 70 wt % of at least one polyurethane:
      (i) having a Mw in the range of from 4,000 to 70,000 g/mol;
      (ii) having 0 to 5 wt % or isocyanate-reactive component(s) bearing ionic or potentially ionic water-dispersing groups;
      (iii) having a free isocyanate group content <0.5 wt %;
   (d) 20 to 85 wt % of a conductive material and wherein (a), (b), (c) and (d) add up to 100%, and the conductive ink having a resolubility within 30 seconds.

2. A conductive ink according to claim 1 comprising 1 to 50 wt % of radiation curable material (b).

3. A conductive ink according to claim 2 wherein the ratio of radiation curable material (b) to polyurethane (c) is in the range of from 9/91 to 40/60.

4. A conductive ink according to claim 2 wherein the radiation curable material (b) is a UV curable material.

5. A conductive ink according to claim 2 wherein the radiation curable material (b) has an average acrylate functionality in the range of from 1 to 5.

6. A conductive ink according to claim 1 wherein the polyurethane (c) is obtained by the reaction of the components:
   (I) 5 to 50 wt % of at least one polyisocyanate;
   (ii) 0 to 20 wt % of at least one isocyanate-reactive component having a Mw in the range of from 50 to 200 gmol;
   (iii) 0 to 90 wt % of at least one isocyanate-reactive component having a Mw in the range of from 201 to 20,000 g/mol;
   (iv) 0 to 95 wt % of at least one isocyanate-reactive component not comprised by (ii) or (iii);
   (v) 0 to 40 wt % of at least one chain-extending and/or chain-terminating component not comprised by (i), (ii), (iii) or (iv);
   where (i), (ii), (iii), (iv) and (v) add up to 100%; in the presence of a solvent;
   where the components comprise 0 to 5 wt % of isocyanate-reactive component(s) bearing ionic or potentially ionic water-dispersing groups.

7. A conductive ink according to claim 1 wherein the polyurethane (c) has a viscosity $\leq$18,000 mPas at any solids content in the range of from 20 to 60 wt %, in a solvent comprising $\geq$70 wt % of at least one solvent having a molecular weight $\leq$105 g/mol.

8. A conductive ink according to claim 1 where the conductive material (d) is selected from the group consisting of conductive particulate materials, conductive flake materials, conductive needle materials, conductive fibres, conductive nanotubes and mixtures thereof.

9. A conductive ink according to claim 1 where the conductive material (d) is selected from silver particulate materials, silver flake materials, copper particulate materials, copper flake materials, silver coated particulate materials, silver coated flake like materials, silver coated fibres, silver coated nanotubes and mixtures thereof.

10. A conductive ink according to claim 1 having a solids content in the range of from 25 to 65 wt %.

11. A conductive ink according to claim 1 having a viscosity in the range of from 50 to 1,000 mPa s.

12. A process for printing an image on a substrate comprising applying thereto a conductive ink according to claim 1 using a process selected from flexographic, gravure and ink jet printing processes.

13. A conductive ink comprising:
   (a) 10 to 75 wt % of at least one solvent comprising <1 wt % of water, wherein the at least one solvent (a) comprises $\geq$75 wt % a solvent having an evaporation rate $\geq$1.0;
   (b) 0 to 50 wt % of at least one radiation curable material:
      (i) having a Mn in the range of from 550 to 3500 g/mol;
      (ii) having an average acrylate function in the range of from 2 to 5;
   (c) 5 to 70 wt % of at least one polyurethane:
      (i) having a Mw in the range of from 6,000 to 55,000 g/mol;
      (ii) having 0 to 5 wt % of isocyanate-reactive component(s) bearing ionic or potentially ionic water-dispersing groups;
      (iii) having a non-detectable free isocyanate group content;
      (iv) having 0 to 0.1 mol of C=C bonds per 100 g; and
   (d) 20 to 85 wt % of a conductive material selected from silver particulate materials, silver flake materials, copper particulate materials, copper flake materials, silver coated particulate materials, silver coated flake like materials, silver coated fibres, silver coated nanotubes and mixtures thereof; and wherein (a), (b), (c) and (d) add up to 100%.

* * * * *